US006223305B1

(12) United States Patent
Simmons et al.

(10) Patent No.: US 6,223,305 B1
(45) Date of Patent: Apr. 24, 2001

(54) METHOD AND APPARATUS FOR RESETTING, ENABLING AND FREEZING A COMMUNICATION DEVICE IN A DIAGNOSTIC PROCESS

(75) Inventors: Philip Simmons, San Jose; Denise Kerstein, Mountain View; Thomas J. Runaldue; Chandan Egbert, both of San Jose; Bahadir Erimli, Mountain View, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/993,047

(22) Filed: Dec. 18, 1997

Related U.S. Application Data

(60) Provisional application No. 60/038,025, filed on Feb. 14, 1997.

(51) Int. Cl.[7] ....................................................... G06F 11/26
(52) U.S. Cl. ............................................................... 714/34
(58) Field of Search ................................. 714/34, 35, 50, 714/15, 16, 23, 30, 46

(56) References Cited

U.S. PATENT DOCUMENTS

| | | | | |
|---|---|---|---|---|
| 4,814,971 | * | 3/1989 | Thatte | 364/200 |
| 5,056,091 | * | 10/1991 | Hunt | 371/14 |
| 5,138,708 | * | 8/1992 | Vosbury | 395/575 |
| 5,515,376 | | 5/1996 | Murthy et al. | |
| 5,633,857 | | 5/1997 | Kim et al. | |
| 5,778,251 | * | 7/1998 | Kuroiwa et al. | 395/834 |
| 5,911,059 | * | 6/1999 | Profit, Jr. | 395/500 |

FOREIGN PATENT DOCUMENTS

| | | |
|---|---|---|
| 0 325 727 A2 | 8/1989 | (EP) . |
| 0 408 527 A2 | 4/1992 | (EP) . |

OTHER PUBLICATIONS

Saunders, S. "LAN Switch Pulls Double Duty: Kalpana's Prostack Ethernet LAN switch checks errors while working in cut–through mode", Data Communications, vol. 24, No. 5, Apr. 1, 1995, pp. 37–38 XP000501578.

* cited by examiner

*Primary Examiner*—Robert Beausoleil
*Assistant Examiner*—Scott T. Baderman

(57) ABSTRACT

A resetting, enabling and freezing system is provided for controlling a communication device in a diagnostic process. A hardware reset of the device may be performed by a host via a reset pin of a PCI interface. A software reset of the device may be provided by setting a reset bit in a command register. To stop operations of the device substantially instantaneously, a freeze mode of diagnostics is provided. The freeze mode may be initiated using hardware or software freezing. To provide the hardware freezing, diagnostic logic is supplied with a freeze signal via a freeze pin of the PCI interface. The software freezing is performed by setting a freeze bit in the command register. To enable a diagnostician to reproduce an event causing an error, an enable/disable mode of diagnostics is carried out. In this mode, elements of the device are disabled one after another in a serial fashion, with a disable signal being passed serially from one element to another. After the elements are disabled, they may be set into a chosen state to recreate a required event.

20 Claims, 6 Drawing Sheets

METHOD AND APPARATUS FOR RESETTING, ENABLING AND FREEZING A COMMUNICATION DEVICE IN A DIAGNOSTIC PROCESS

The present application claims the priority of provisional application No. 60/038,025, filed Feb. 14, 1997.

TECHNICAL FIELD

The present invention relates to the field of data communications, and more particularly, to a diagnostic procedure performed in a data communication device.

BACKGROUND ART

Subtle errors in a communication device may degrade its performance and reduce efficiency without completely shutting down any portion of the device. The causes of such errors can lie in many different device components. Ascertaining all the causes requires sophisticated test equipment and highly trained personnel. Communications problems can also be random and troublesome to reproduce.

Therefore, it would be desirable to provide a diagnostic system that would allow a diagnostician to stop a device so as to set its elements into a chosen state, in order to recreate an event that may be hard to capture during actual operation of the device.

Further, to prevent data loss and increase efficiency of the device, it would be desirable to restart the device from its disable state without a reset.

Moreover, to achieve flexibility during a diagnostic procedure, it would be desirable to provide a device that combines a freezing diagnostic mode for stopping operations of the device immediately, with a disable/enable diagnostic mode for stopping elements of the device in a serial fashion after their current operations are completed.

DISCLOSURE OF THE INVENTION

Accordingly, an advantage of the present invention is in providing a communication device that combines a freezing diagnostic mode for stopping operations of the device instantaneously to examine its elements, with a disable/enable diagnostic mode for stopping elements of the device in a serial fashion after their current operations are completed.

Another advantage of the present invention is in providing a diagnostic system that would allow a diagnostician to disable a communication device so as to set its elements into a chosen state, in order to recreate an event that may be hard to capture during actual operation of the device.

A further advantage of the present invention is in providing a communication device that may be restarted from its disable state without a reset.

The above and other advantages of the invention are achieved, at least in part, by providing a communication system that comprises a host interface for providing a host with access to internal elements of the system. Diagnostic circuitry is provided for stopping the internal elements immediately in response to a freeze signal from the host processor, and for stopping the internal elements serially so as to cause each of the internal elements to stop after completing currently performed operations, in response to a disable signal from the host processor.

In accordance with one aspect of the invention, the host is enabled to set the internal elements into a chosen state after the elements are stopped by the disable signal. The host may produce an enable signal for restarting the internal elements from the chosen state without resetting them to an initial state.

In accordance with another aspect of the invention, the disable signal is produced by setting an enable bit in a command register into a first logic state, whereas the enable signal is produced by setting the enable bit into a second logic state.

In accordance with a further aspect of the invention, the internal elements pass the disable signal serially from one to another in a sequence preset so as to enable the internal elements to complete their current operations. The host may be enabled to monitor internal states of the elements after the elements are stopped by the disable signal.

In accordance with a further aspect of the invention, a reset signal may be produced to reset the internal elements to their initial state.

In accordance with another aspect of the invention, the internal elements are reset to their initial state to restart the system after freezing.

In accordance with another aspect of the invention, the freeze signal may be transferred via the host interface, or produced by setting a freeze bit in the command register into a predetermined logic state In accordance with a method of the present invention, the following steps are carried out to perform a diagnostic procedure to detect an error in a communication device:

(a) stopping internal elements of the communication device immediately in response to a freeze signal, and (b) stopping the internal elements serially so as to cause each of the internal elements to stop after completing currently performed operations, in response to a disable signal.

The disable signal may be passed serially from one internal element to another in a sequence preset so as to enable the internal elements to complete current operations. After disabling the internal elements, they may be set to a chosen state.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature and not as restrictive.

BEST MODE FOR CARRYING OUT THE INVENTION

Figure 1:
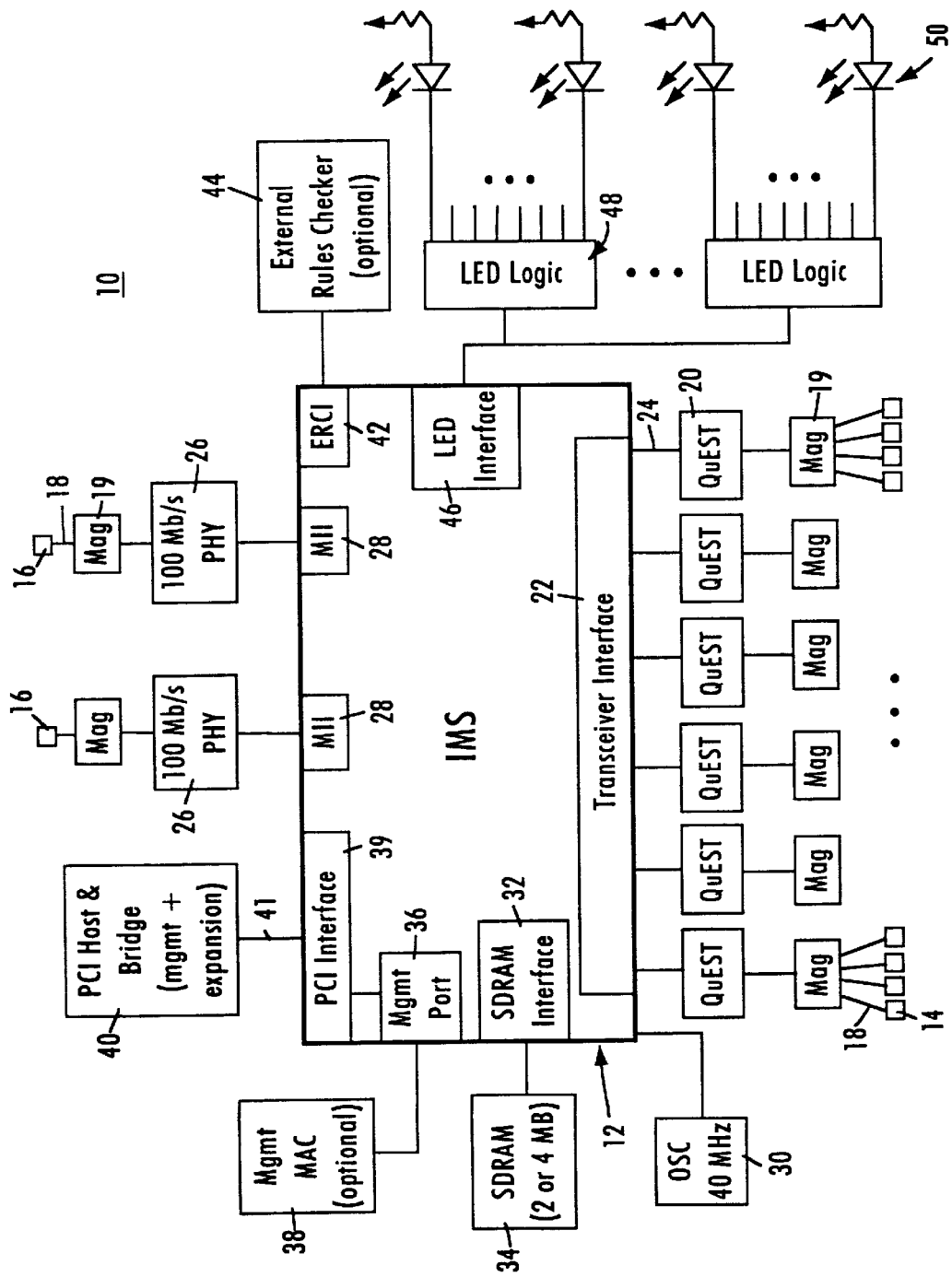
FIG. 1 is a block diagram of an exemplary system in which the present invention may be advantageously employed.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3×Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. Further, the multiport switch 12 includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 via a management MAC interface 38. Also, the multiport switch 12 includes a PCI interface 39 connected to a host processor 40 via a PCI bus 41. The PCI interface 39 enables the PCI host processor 40 to access the internal IMS registers and the external memory 34. Alternatively, a PCI expansion bus may be attached to the PCI interface 39 to connect the switch 12 to other IMS devices.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2A:
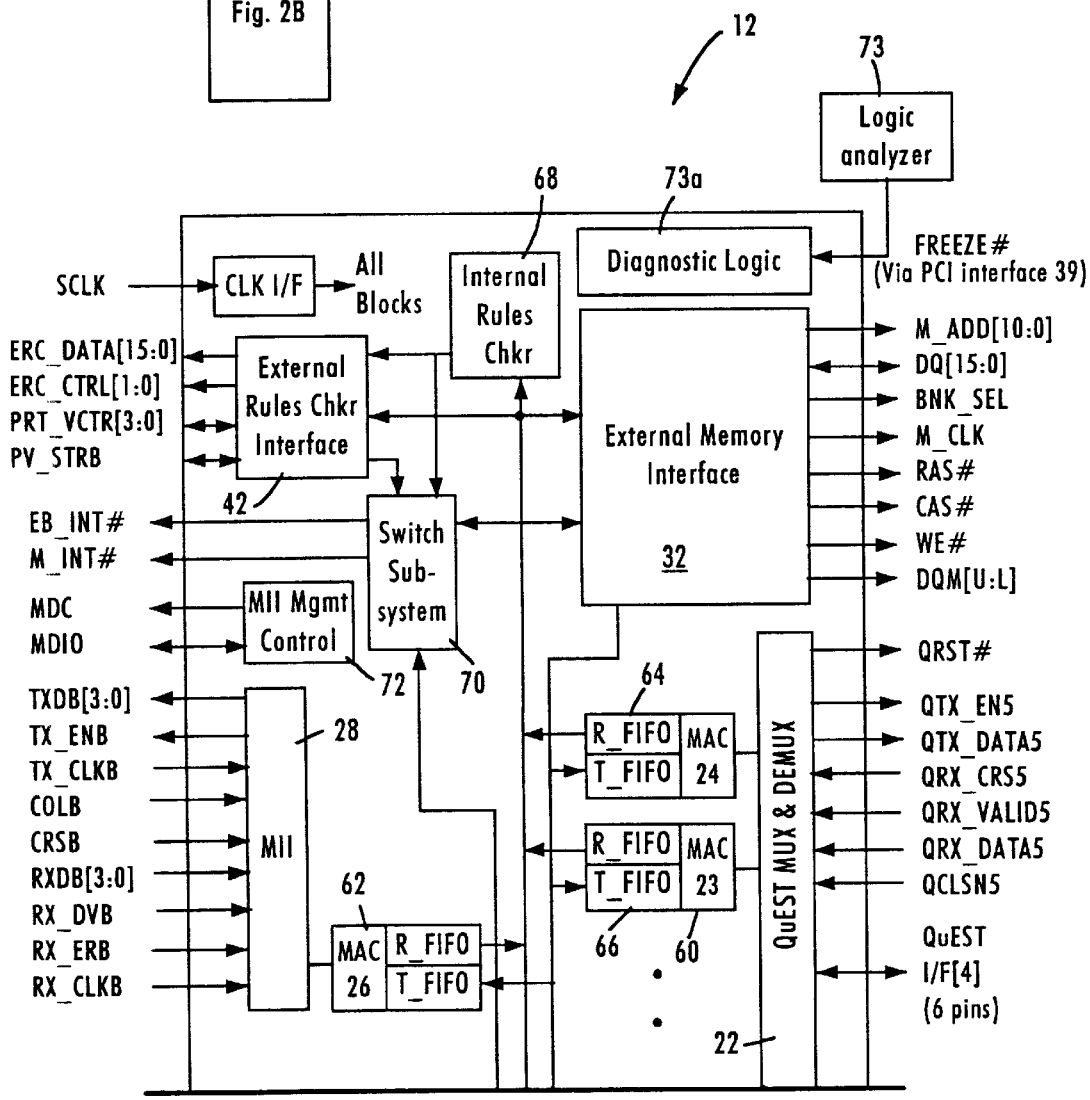
FIG. 2 is a block diagram of a multiport switch.
Figure 2B:
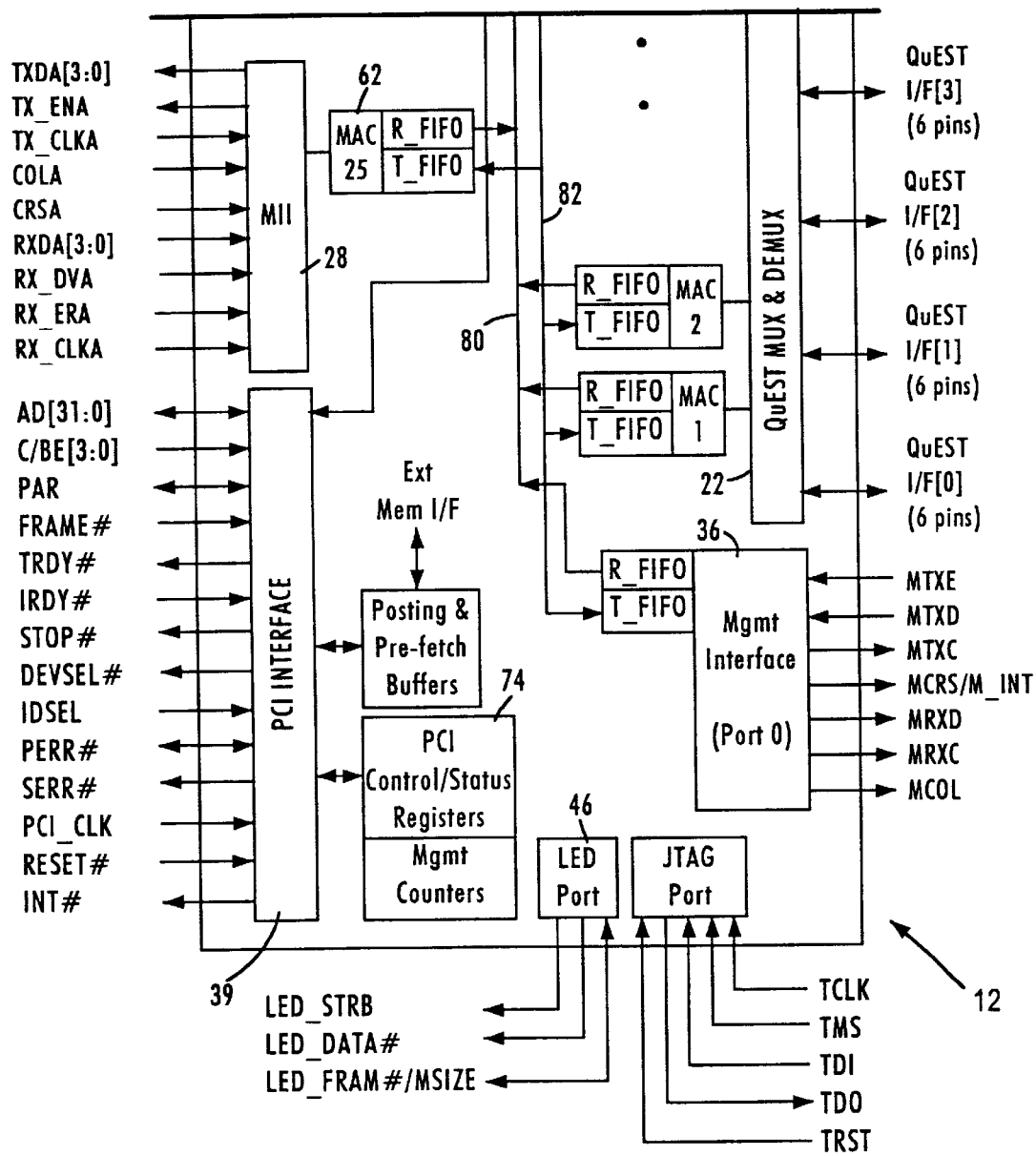

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3 u). For example, the management data interface 72 outputs a management data clock (MDC) providing a timing reference on the bidirectional management data IO (MDIO) signal path.

The PCI interface 39 may be a 32-bit PCI revision 2.1 compliant slave interface for providing the PCI host processor 40 with access to internal IMS status and configuration registers 74, and to the external memory SDRAM 34.

Write posting and read prefetch buffers are arranged between the PCI interface 39 and the external memory interface to support host processor access to the external memory 34. The PCI interface 39 can also be coupled to an expansion bus for connecting multiple IMS devices with each other.

Also, the PCI interface 39 may provide an external logic analyzer 73 with access to the IMS 12 for performing a dignostic procedure to detect errors in the IMS 12. During the diagnostic procedure, the logic analyzer 73 may act as a PCI host to carry out a data exchange with the IMS 12 via the PCI interface 39. A conventional logic or packet analyzer, such as a logic analyzer manufactured by Hewlett-Packard, may be used as the logic analyzer 73. The logic analyzer 73 may produce a freeze signal supplied via a FREEZE pin of the PCI interface 39 to a diagnostic logic 73*a* arranged on the IMS 12. In response to the freeze signal, the diagnostic logic 73*a* causes internal elements of the IMS to stop their operations, in order to carry our a diagnostic procedure. Alternatively, the freeze signal may be sypplied by a microprocesor controlling a diagnostic procedure. The diagnostic logic 73*a* may be implemented by a state machine that causes the internal elements to stop when the freeze signal is received.

The management port 36 interfaces to an external MAC engine through a standard seven-wire inverted serial GPSI interface, enabling a host controller access to the multiport switch 12 via a standard MAC layer protocol.

Figure 3:
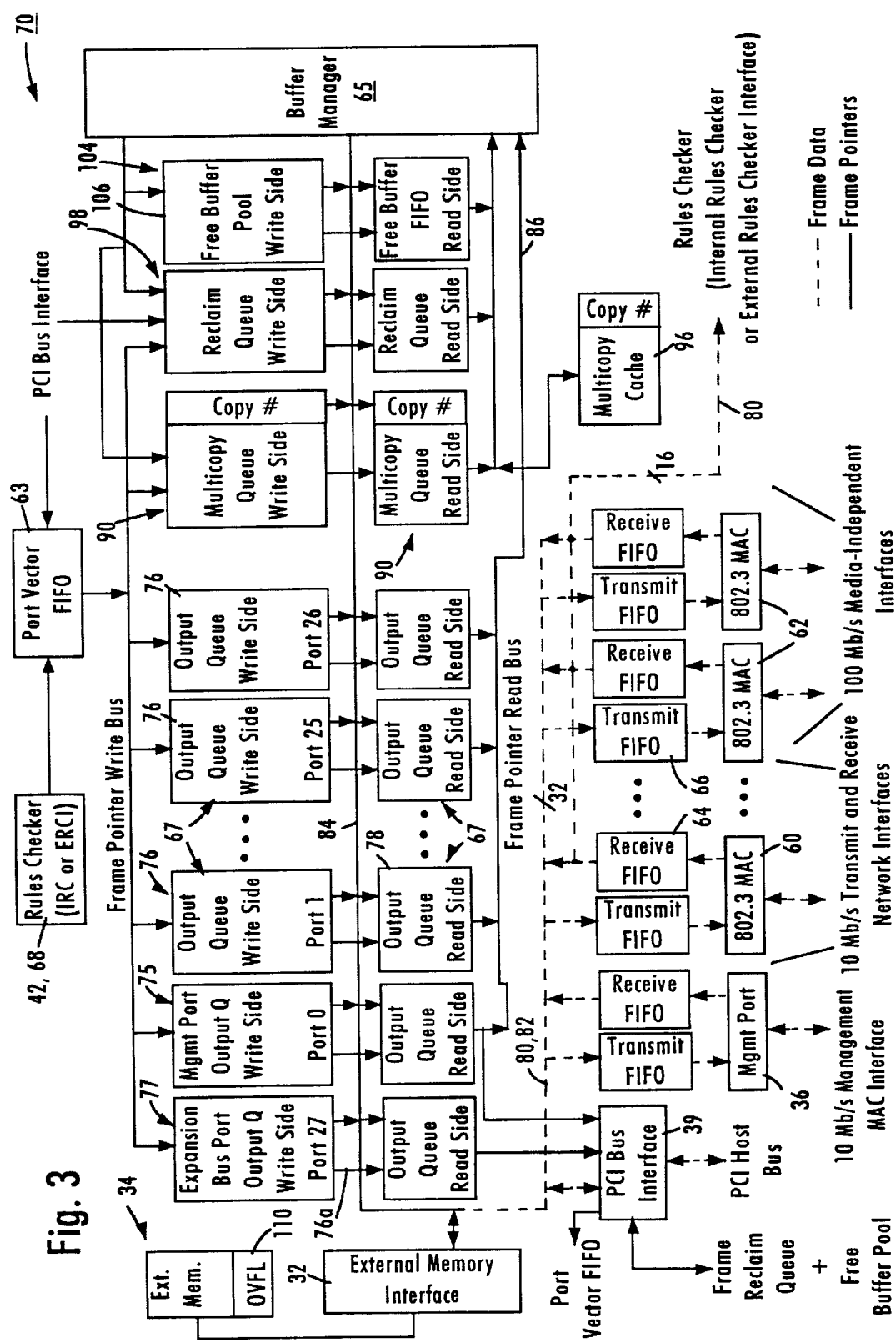
FIG. 3 depicts the switch subsystem of the multiport switch according to an exemplary embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed, and is configured within the output queue in a manner that the a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78, and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12, and thus provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 63 writing frame pointers into the various output queues 67, 75 and 77 indicated in a forwarding port vector.

Figure 4:
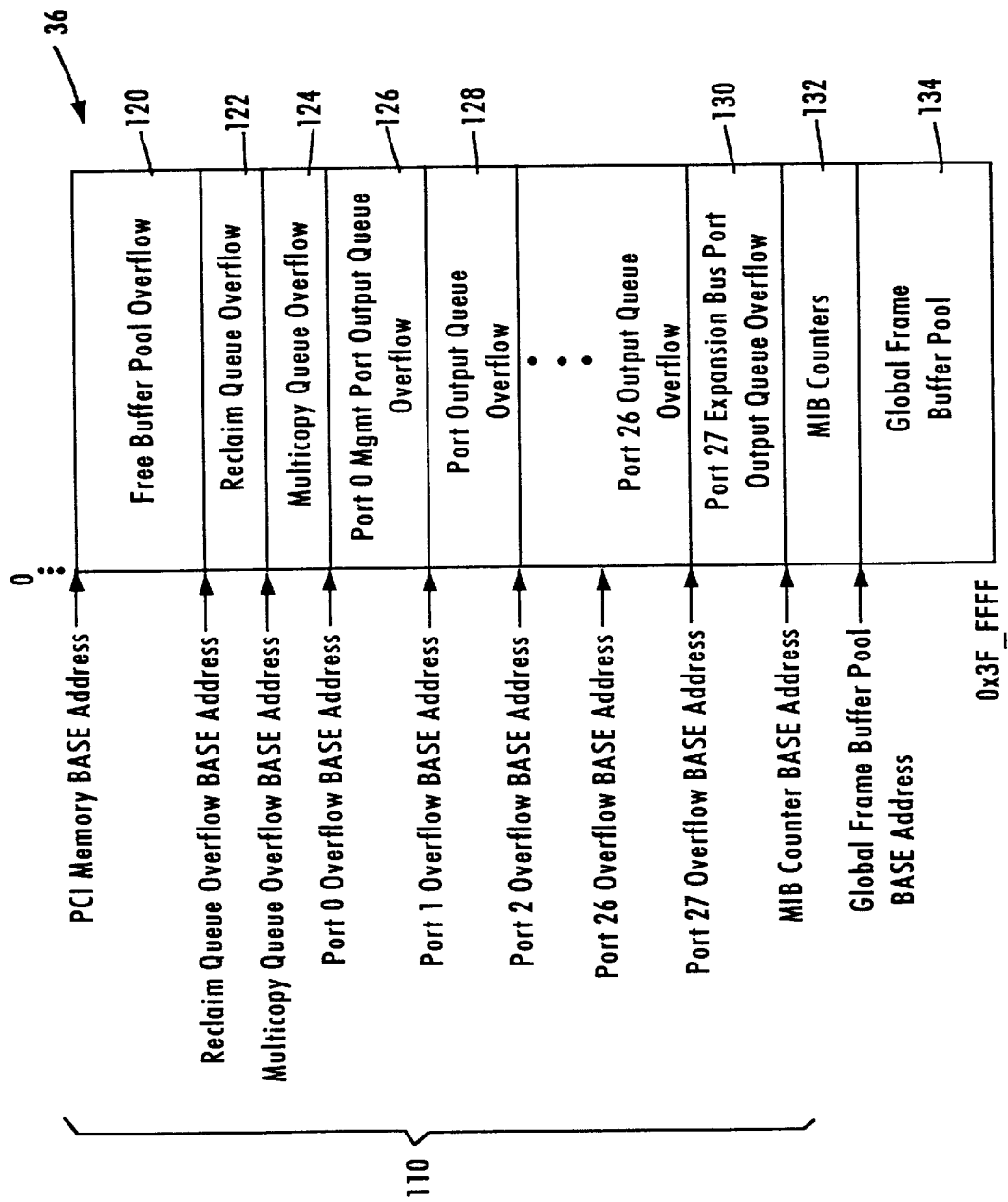
FIG. 4 is a diagram illustrating an exemplary map of an external memory in the multiport switch.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 75 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor 40.

As discussed above, the multiport switch 12 comprises the PCI interface 39 which may be a 32-bit PCI revision 2.1 compliant interface arranged on the IMS chip to support communications with the host processor 40 via the PCI bus 41. The PCI interface 39 allows the PCI host processor 40 to read and write from and to the internal IMS status and configuration registers 74, and to read and write from and to the external memory SDRAM 34. During PCI data transfer operations, the host processor 40 acts as a master that controls the PCI bus 41 to send and receive signals to and from the slave PCI interface 39.

As shown in FIG. 2, the PCI interface 39 comprises 32 address/data bus interface pins AD[31:0]. PCI address and data signals are multiplexed on the same bus interface pins. For the first cycle of a transaction, AD[31:0] contain a 32-bit address. During subsequent clocks of the transaction, the address/data bus interface pins contain data. For example, AD[31:24] may contain the most significant byte, whereas AD[7:0] may correspond to the least significant byte.

Bus command (C) and byte enable (BE) signals are multiplexed on four bus interface pins C/BE[3:0]#. During the address phase of a transaction, the C/BE[3:0]# pins define a 4-bit bus command C. During the data phase, the PCI interface 39 receives a 4-bit BE signal via the C/BE [3:0]#.

RESET# pin enables the host 40 to supply the IMS 12 with a reset signal that causes the IMS 12 to perform internal system hardware reset. The hardware reset includes resetting all logic, state machines and register values of the IMS to their default states. While the reset signal is asserted, the IMS disables or deasserts all outputs, and does not respond to inputs.

Instead of the hardware reset, a software reset of the IMS 12 may be performed. To initiate the software reset, the host 40 may set a software reset bit in a switch command register arranged among the PCI control/status registers 74. The software reset bit may be cleared automatically when the software reset is complete. The PCI host 40 may poll this bit to determine when the software reset is complete.

Similarly to the hardware reset, the software reset results in resetting all logic, state machines and register values of the IMS to their default states. Only PCI configuration registers retain the same contents as before the software reset.

In certain embodiments, the PCI interface 39 also contains a FREEZE# pin for transferring a freeze signal to the diagnostic logic 73a. For example, the PCI interface may provide the external logic analyzer 73, such as a logic analyzer manufactured by Hewlett-Packard, with access to the IMS 12. The logic analyzer 73 may act as a PCI host to supply the freeze signal via the FREEZE# pin to the diagnostic logic 73a. In response to the freeze signal, the diagnostic logic 73a causes internal elements of the IMS 12 to stop, in order to carry our diagnostic operations. Alternatively, the freeze signal may be sypplied by a microprocesor controlling a diagnostic procedure. The diagnostic logic 73a may be implemented by a state machine that causes the internal elements to stop when it receives the freeze signal. For example, each of the internal elements may be provided with a state machines that terminates operations of the corresponding element in response to a signal from the diagnostic logic 73a.

Instead of hardware freezing initiated via the FREEZE# pin, software freezing may be carried out when a PCI host sets a freeze bit in the switch command register.

Other IMS pins that support PCI interface 39 are briefly described below. PAR pin provides an even parity signal for the signals on the AD[31:0] and C/BE[3:0] pins. FRAME# pin is driven by the PCI host at the beginning of the address phase to indicate that valid address and command respectively exist on the AD and C/BE# pins. TRDY# signal indicates the ability of the IMS 12 to complete the current data phase. IRDY# signal indicates the ability of the host to complete the current data phase. STOP# pin is driven by the IMS 12 to request the PCI host to stop the current bus transaction. DEVSEL# pin is driven by the IMS 12 to claim the access cycle for the current transaction after it decodes its address on the AD[31:0] pins. IDSEL pin contains a chip select signal for the IMS 12. PERR# signal is asserted by the IMS 12 if a parity error is detected during the write data phase. SERR# signal is asserted by the IMS 12 if a parity error is detected during the address phase. PCI_CLK signal is used for timing the PCI interface logic. INT# pin provides an interrupt signal.

A freeze mode carried out for diagnostic purposes is initiated when the diagnostic logic 73a receives a freeze signal supplied via the pin FREEZE#, or produced when the freeze bit is set in the switch command register. In response to the freeze signal, the IMS 12 is forced to halt its operations after several clock cycles. The contents of the various registers in the IMS 12 is saved upon reception of the freeze signal by the diagnostic logic 73a. The PCI interface 39 continues to operate in the freeze mode to maintain the host access to the SDRAM and the IMS registers. This allows the host processor 40 to terminate the freeze state of the IMS 12 to assist debugging.

If the INS 12 is in the process of receiving a frame when the hardware or software freezing is initiated, the corresponding MAC port will halt, and no more bytes of the frame will be received.

If the IMS 12 is in the process of transmitting a frame when the hardware or software freezing is initiated, the frame will be abandoned at any point during the transmission in response to the freeze signal.

In the freeze mode, all data queues established in the IMS 12 remain in their states existing at the time when the freeze signal is received by the diagnostic logic 73a, the IMS internal timer halts, and the rules checkers 42 and 68 stop lookup and learning operations. Thus, the host 40 is enabled to check these functions. Internal diagnostic registers may be arranged in the PCI interface 39 to assist the host 40 in providing diagnostic operations.

If an update of the LED display elements 50 is in progress when the freeze signal is received by the diagnostic logic 73a, the LED interface 46 will complete data output so that valid data is displayed by the LED display elements 50. However, no new LED update will commence.

In the freeze mode, auto-polling of the physical devices 26 and switch transceivers 20 is terminated after the current cycle is completed. However, the host 40 may initiate new operations to read the status of the physical devices 26.

To restart the IMS 12 after the freeze mode, a hardware or software reset may be performed.

Thus, the freezing enables a diagnostician to instantaneously stop IMS operations to examine the IMS elements, such as internal registers, in order to detect an error or malfunction.

To enable the diagnostician to set the IMS elements to chosen states in order to recreate an event that may be otherwise hard to capture, the IMS 12 supports an enable/disable mode of operation, in which the IMS elements are disabled in a serial fashion.

To enable or disable the IMS, the host 40 asserts or deasserts an enable bit in the switch command register. For example, setting the enable bit equal to 1 may enable the IMS activity, whereas the enable bit equal to 0 may disable the IMS.

In response to a disable signal, elements of the IMS 12 are sequentially disabled one after another. The disable signal is passed serially from one element of the IMS 12 to another to disable each element in turn. For example, a null frame pointer composed of zero bits may be used as the disable signal.

The PCI interface 39 remains active to allow the host 40 to access disabled elements. When an IMS element is disabled, it stops in a state that allows the host processor 40 to monitor the internal state of the element via the PCI interface 39.

Each IMS element may be set into a chosen state after the IMS 12 is disabled. For example, required data may be written into an internal register when the register is disabled. This allows an event within the IMS 12 to be recreated in order to detect an error or malfunction.

Figure 5:
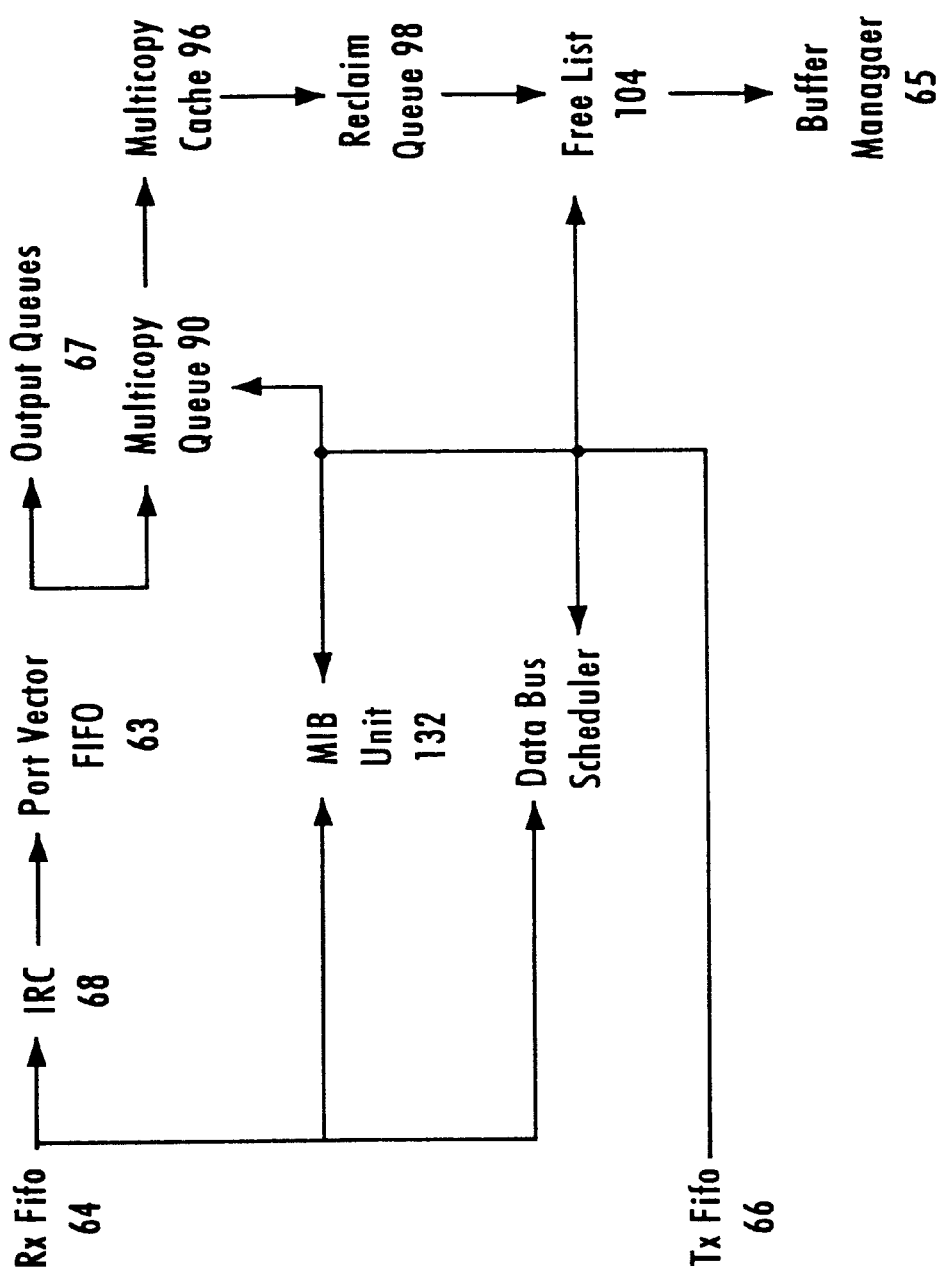
FIG. 5 is a diagram illustrating an exemplary sequence, in accordance with embodiment of the present invention, performed to disable elements of the multiport switch.

Reference is now made to FIG. 5 that shows a diagram illustrating a sequence carried out to disable elements within the IMS. When the host processor 40 sets the enable bit in the switch command register in a disable state, a disable signal is supplied to the receive FIFOs 64 and the transmit FIFOs 66 in the MAC ports 60, 62 or 36.

In response to the disable signal, each receive FIFO 64 completes receiving any currently received packet. A new free frame pointer may be requested, if necessary, from the free buffer pool 104. After the currently received packet is completed, the receive FIFO 64 sends a report to the MIB counter 132. Thereafter, the receive FIFO 64 accepts no new packets.

Then, the received data from the receive FIFO 64 is transferred to the SDRAM 32. After the frame header of the last received packet is updated, the receive FIFO 64 stops.

From the receive FIFOs 64, the disable signal is passed to the MIB counters 132 and a data bus scheduler in the buffer manager 65. The MIB counters 132 complete their update based on the last reports from the receive and transmit FIFOs, and write the latest data to the SDRAM. Thereafter, the MIB counters 132 stop. The data bus scheduler that controls data transfers over the data bus 80 completes its current transfer to the memory 34 and stops.

After the receive FIFOs 64 stop, the disable signal is also passed to the internal rules checker (IRC) 68. In response, the IRC 68 completes processing the last packets received from the receive FIFOs 64 and stops.

From the IRC 68, the disable signal is passed to the port vector FIFO 63 that completes transferring frame pointers to various queues and stops.

After disabling the port vector FIFO 63, the disable signal is transferred to the output queues 67 and multicopy queue 90, which complete their current transfers to the memory 34 and stop.

After the multicopy queue 90 stops, the disable signal is passed to the multicopy cache 96, which completes its current transfers to the memory 34 and stops.

From the multicopy cache 96, the disable signal is transferred to the reclaim queue 98, which completes its current transfers to the memory 34 and stops.

The reclaim queue 98 transfers the disable signal to the free buffer pool 104, which stops after completing its current transfers to the memory 34.

Finally, the buffer manager 65 receives the disable signal from the free buffer pool 104, completes its current memory transfers and stops.

In response to the disable signal, each transmit FIFO 66 completes the transmission of all packets stored therein, and sends a report to the MIB counters 132. The remaining free frame pointers are returned to the free buffer pool 104.

Similarly to the receive FIFOs 64, the transmit FIFOs 66 pass the disable signal to the MIB counters 132 and the data bus scheduler in the buffer manager 65. Simultaneously, the transmit FIFOs 66 transfer the disable signal to the multicopy queue 90 and the free buffer pool 104. As shown in FIG. 5, when these units stop, the disable signal is passed along the same path as the disable signal from the receive FIFOs 64. In particular, the multicopy queue 90 transfers the disable signal to the multicopy cache 96, which passes it to the reclaim queue 98. The free buffer pool 104 passes the disable signal to stop the buffer manager 65.

In response to the disable signal, each of the units stops in a state, in which its internal status is accessible to the host 40 through the PCI interface 39. For example, the host 40 is able to write and read to or from registers of the disabled units. During a diagnostic procedure, the host 40 may set the disabled units into a chosen state, for example, to reproduce an event that causes an error.

When the enable bit in the switch command register is set to a switch enable state, for example, to 1, the disabled units will be enabled from their current states. A reset which would result in loss of data and increase the recovery time is not necessary to restart the IMS activity.

There accordingly has been described a system for controlling a communication device in a diagnostic process. A hardware reset of the device may be provided by a host via a reset pin of a PCI interface. A software reset of the device may be performed by setting a reset bit in a command register. To stop operations of the device substantially instantaneously, a freeze mode of diagnostics is provided. The freeze mode may be initiated using hardware or software freezing. To provide the hardware freezing, a diagnostic logic is supplied with a freeze signal via a freeze pin of the PCI interface. The software freezing is performed by setting a freeze bit in the command register. To enable a diagnostician to reproduce an event causing an error, an enable/disable mode of diagnostics is carried out. In this mode, elements of the device are disabled one after another in a serial fashion, with a disable signal being passed serially from one element to another. After the elements are disabled, they may be set into a chosen state to recreate a required event.

In this disclosure, there are shown and described only the preferred embodiments of the invention, but it is to be understood that the invention is capable of changes and modifications within the scope of the inventive concept as expressed herein.

What is claimed is:

1. A communication system, comprising:
   a host interface for providing a host with access to internal elements of said communication system, and
   diagnostic circuitry for stopping said internal elements immediately in response to a freeze signal from said host, and for stopping said internal elements serially so as to cause each of the internal elements to stop after completing currently performed operations, in response to a disable signal from said host.

2. The system of claim 1, wherein said host is enabled to set said internal elements into a chosen state after said internal elements are stopped in response to said disable signal.

3. The system of claim 2, wherein said host produces an enable signal for restarting said internal elements from said chosen state without resetting said internal elements to an initial state.

4. The system of claim 3, wherein said internal elements are reset to said initial state to restart said system after supplying said freeze signal.

5. The system of claim 1, wherein said host is enabled to monitor an internal state of said internal elements after said internal elements are stopped in response to said disable signal.

6. The system of claim 5, wherein said disable signal is produced by setting an enable bit in a command register into a first logic state.

7. The system of claim 6, wherein an enable signal is produced by setting said enable bit in said command register into a second logic state.

8. The system of claim 7, wherein said freeze signal is produced by setting a freeze bit in said command register into a predetermined logic state.

9. The system of claim 7, wherein said freeze signal is transferred via said host interface.

10. The system of claim 5, wherein said internal elements pass said disable signal serially from one to another in a sequence preset so as to enable said internal elements to complete current operations.

11. The system of claim 10, wherein said internal elements include a transmission register for storing data currently transmitted by said communication system.

12. The system of claim 11, wherein transmission of said data is terminated immediately after receiving said freeze signal.

13. The system of claim 12, wherein the transmission of said data from said transmission register is completed after supplying said disable signal to said transmission register.

14. The system of claim 10, wherein said internal elements include a reception register for storing data of a packet being currently received by said communication system.

15. The system of claim 14, wherein reception of said packet is terminated immediately after receiving said freeze signal.

16. The system of claim 15, wherein the reception of said packet is completed after said disable signal is supplied to said reception register.

17. The system of claim 5, wherein said host produces a reset signal to place said internal elements into an initial state.

18. A method of performing a diagnostic procedure to detect an error in a communication device, comprising the steps of:

(a) stopping internal elements of said communication device immediately in response to a freeze signal, and (b) stopping said internal elements serially so as to cause each of the internal elements to stop after completing currently performed operations, in response to a disable signal.

19. The method of claim 18, wherein said step (b) comprises the step of passing said disable signal serially from one internal element to another in a sequence preset so as to enable said internal elements to complete current operations.

20. The method of claim 19, further comprising the step of setting said internal elements to a chosen state after stopping said internal elements by said disable signal.

* * * * *